United States Patent
Joo et al.

(10) Patent No.: US 12,022,687 B2
(45) Date of Patent: Jun. 25, 2024

(54) DISPLAY PANEL

(71) Applicant: Samsung Display Co., Ltd., Yongin-Si (KR)

(72) Inventors: Sun-kyu Joo, Suwon-si (KR); Keunchan Oh, Hwaseong-si (KR); Byungchul Kim, Hwaseong-si (KR); Inok Kim, Osan-si (KR); Gakseok Lee, Hwaseong-si (KR); Jaemin Seong, Suwon-si (KR); Inseok Song, Pocheon-si (KR); Jieun Jang, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 124 days.

(21) Appl. No.: 17/484,816

(22) Filed: Sep. 24, 2021

(65) Prior Publication Data

US 2022/0037628 A1  Feb. 3, 2022

Related U.S. Application Data

(63) Continuation of application No. 16/566,749, filed on Sep. 10, 2019, now Pat. No. 11,165,049.

(30) Foreign Application Priority Data

Nov. 9, 2018  (KR) .................. 10-2018-0136970

(51) Int. Cl.
*H01L 27/14* (2006.01)
*H10K 50/86* (2023.01)
(Continued)

(52) U.S. Cl.
CPC .......... *H10K 50/865* (2023.02); *H10K 59/12* (2023.02); *H10K 59/38* (2023.02);
(Continued)

(58) Field of Classification Search
CPC ...... H10K 50/865; H10K 59/12; H10K 59/38; H10K 59/351; G02F 1/133512;
(Continued)

(56) References Cited

U.S. PATENT DOCUMENTS 7,511,788 B2  3/2009  Kim et al.
7,538,850 B2  5/2009  Kim et al.
(Continued)

FOREIGN PATENT DOCUMENTS

CN  1627169 A  6/2005
CN  104698670 A  6/2015
(Continued)

OTHER PUBLICATIONS

C. Russo, B. Apicella, J.S. Lighty, A. Ciajola, A. Tregrossi, "Optical properties of organic carbon and soot produced in an inverse diffusion flame", Carbon 124 (2017) 372-379.
(Continued)

*Primary Examiner* — Tan N Tran
(74) *Attorney, Agent, or Firm* — Innovation Counsel LLP

(57) ABSTRACT

A display panel includes a first display substrate including first to third pixel areas and a light blocking area that is adjacent to the first to third pixel areas and a second display substrate including first to third display elements respectively overlapping the first to third pixel areas. The first display substrate includes a base substrate, a first color filter overlapping the first pixel area and having a first color, a second color filter overlapping the second pixel area and having a second color different from the first color, a third color filter disposed on the base substrate, having a third color different from the first and second colors, and including a filter portion overlapping the third pixel area and a light blocking portion overlapping the light blocking area, and a
(Continued)

light blocking member disposed on the light blocking portion and containing a black organic pigment.

17 Claims, 14 Drawing Sheets

(51) Int. Cl.
*H10K 59/12* (2023.01)
*H10K 59/38* (2023.01)
*G02F 1/1335* (2006.01)
*G02F 1/13357* (2006.01)

(52) U.S. Cl.
CPC .. *G02F 1/133512* (2013.01); *G02F 1/133514* (2013.01); *G02F 1/133617* (2013.01)

(58) Field of Classification Search
CPC ......... G02F 1/133514; G02F 1/133617; G02F 1/133519; G02F 1/133509; G09F 9/30; H01L 51/5284; H01L 27/322; H01L 27/3213; H01L 27/3244
USPC .............................................. 257/40, 59, 72
See application file for complete search history.

(56) References Cited

U.S. PATENT DOCUMENTS

| | | | |
|---|---|---|---|
| 8,917,338 B2 | 12/2014 | Otsuka et al. | |
| 9,488,861 B2 | 11/2016 | Ke | |
| 9,673,263 B2 | 6/2017 | Ono et al. | |
| 9,774,000 B2 | 9/2017 | Kim | |
| 9,971,185 B2 | 5/2018 | Kimura et al. | |
| 9,989,825 B2* | 6/2018 | Takeda ............. | G02F 1/136209 |
| 10,026,788 B2 | 7/2018 | Lim et al. | |
| 10,032,803 B2 | 7/2018 | Kun et al. | |
| 10,048,530 B1* | 8/2018 | Kim ................. | G02F 1/133617 |
| 10,763,312 B2* | 9/2020 | Jo .......................... | G06F 3/0412 |
| 10,811,637 B2 | 10/2020 | Choi et al. | |
| 2015/0162357 A1 | 6/2015 | Miyanaga et al. | |
| 2015/0198845 A1 | 7/2015 | Lee et al. | |
| 2015/0340510 A1 | 11/2015 | Miyanaga et al. | |
| 2018/0006093 A1 | 1/2018 | Kim et al. | |

FOREIGN PATENT DOCUMENTS

| | | |
|---|---|---|
| CN | 104779254 A | 7/2015 |
| CN | 104898372 A | 9/2015 |
| EP | 2711766 A1 | 3/2014 |
| JP | 2004-265752 A | 9/2004 |
| JP | 2011-158625 A | 8/2011 |
| JP | 2015050096 A | 3/2015 |
| JP | 2015-111190 A | 6/2015 |
| JP | 2015-180932 A | 10/2015 |
| JP | 2016-075736 A | 5/2016 |
| KR | 20040081947 A | 9/2004 |
| KR | 10-2015-0105248 A | 9/2015 |
| KR | 10-2016-0031652 A | 3/2016 |
| TW | 201535050 A | 9/2015 |

OTHER PUBLICATIONS

Erin M. Adkins, J. Houston Miller, "Extinction Measurements for Optical Band Gap Determination of Soot in a Series of Nitrogen-Diluted Ethylene/Air Non-Premixed Flames", Physical Chemistry Chemical Physics, Issue 4, 2014.

European Communication corresponding to European Patent Application No. 19208133.9 dated Jul. 20, 2021 4 pages.

* cited by examiner

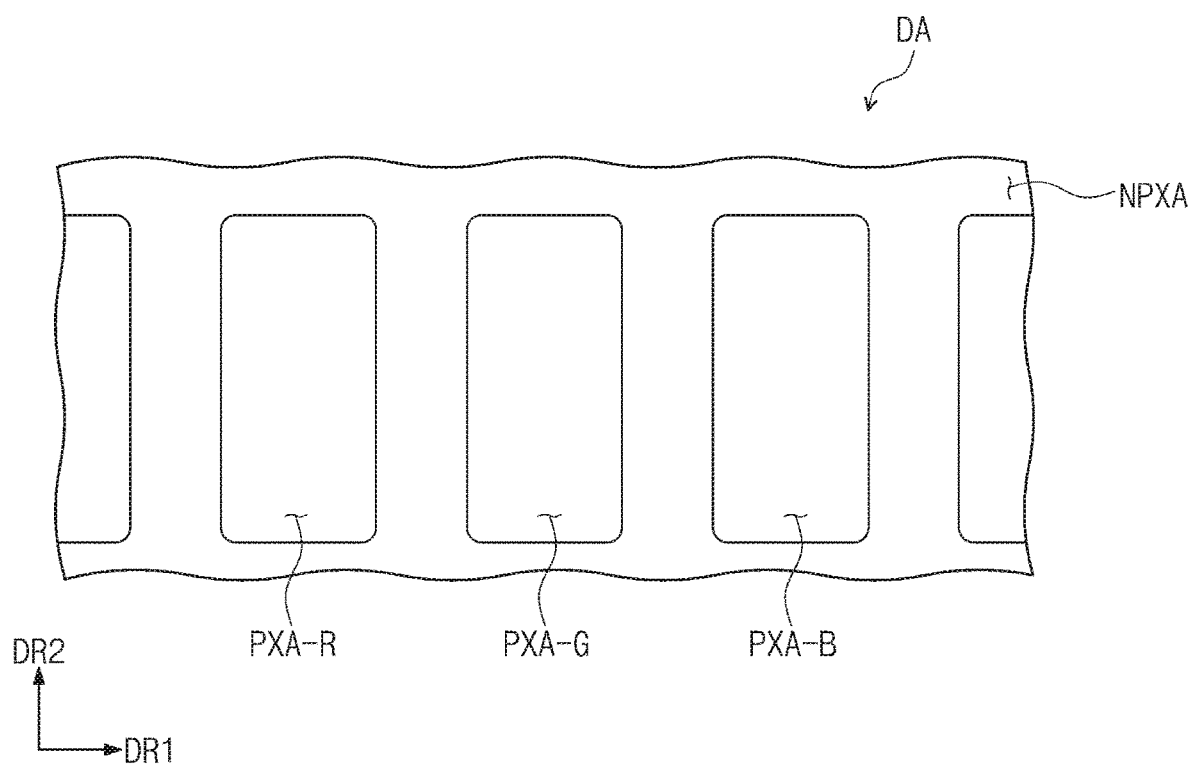

DISPLAY PANEL

CROSS-REFERENCE TO RELATED APPLICATIONS

This U.S. non-provisional patent application is a continuation application of U.S. patent application Ser. No. 16/566,749 filed Sep. 10, 2019, which claims priority under 35 U.S.C. § 119 of Korean Patent Application No. 10-2018-0136970, filed on Nov. 9, 2018, the disclosures of which are hereby incorporated by reference in their entirety.

BACKGROUND

The present disclosure herein relates to a display panel, and more particularly, to a display panel including a color filter.

Various display apparatuses are used in multimedia equipment such as televisions, mobile phones, table computers, navigation devices, and game consoles. A display device may include a transmissive display panel selectively transmitting source light generated from a light source or an emissive display panel generating source light in the display panel itself.

When the display device is used in an outdoor space, reflection and scattering by external light may occur on a display surface deteriorating quality of the displayed image.

SUMMARY

The present disclosure provides a display panel that is capable of reducing reflection of external light that may occur on an interface between a display substrate and a light blocking member.

An embodiment of the inventive concept provides a display panel including: a first display substrate including a first pixel area, a second pixel area, a third pixel area, and a light blocking area that is adjacent to the first pixel area, a second pixel area, and the third pixel area; and a second display substrate including a first display element, a second display element, and a third display element respectively overlapping the first pixel area, the second pixel areal, and the third pixel area, wherein the first display substrate includes: a base substrate; a first color filter disposed on the base substrate to overlap the first pixel area and having a first color; a second color filter disposed on the base substrate to overlap the second pixel area and having a second color that is different from the first color; a third color filter disposed on the base substrate having a third color that is different from the first color and the second color, and including a filter portion overlapping the third pixel area and a light blocking portion overlapping the light blocking area; and a light blocking member disposed on the light blocking portion and containing a black organic pigment.

In an embodiment, the light blocking member may be spaced from each of the first pixel area, the second pixel area, and the third pixel area by a predetermined distance on a plane of the first display substrate.

In an embodiment, a first opening corresponding to the first pixel area and a second opening corresponding to the second pixel area may be defined in the third color filter, and each of the first opening and the second opening may have a first width that is greater than a second width of the light blocking member disposed between the first opening and the second opening.

In an embodiment, the light blocking member may further include a base resin in which the black organic pigment is dispersed.

In an embodiment, the light blocking member may further include hollow silica dispersed in the base resin.

In an embodiment, the light blocking member may further include perylene dispersed in the base resin.

In an embodiment, the light blocking member may further include a blue pigment and a carbon black that are dispersed in the base resin.

In an embodiment, the black organic pigment may have a first weight, the blue pigment may have a second weight, and the carbon black may have a third weight, and the first weight may be greater than the second weight, and the second weight may be greater than the third weight.

In an embodiment, the first display substrate may further include a light control layer, wherein the light control layer may include: a first color conversion part disposed on the first color filter and including a first light emitting body that absorbs third light of the third color and output first light of the first color; a second color conversion part disposed on the second color filter and including a second light emitting body that absorbs the third light of the third color and output second light of the second color; and a color transmission part configured to transmit the third light of the third color.

In an embodiment, each of the first display element, the second display element, and the third display element may output the third light of the third color to the light control layer.

In an embodiment, the third color may be a blue color, the second color may be a green color, and the first color may be a red color.

In an embodiment, the first display substrate may further include an auxiliary color filter disposed on the light blocking member and having the first color or the second color.

In an embodiment, the first color filter, the second color filter, and the third color filter may be directly disposed on the base substrate.

In an embodiment of the inventive concept, a display panel includes: a first display substrate including a first pixel area, a second pixel area, a third pixel area, and a light blocking area that is adjacent to the first pixel area, the second pixel area, the third pixel area; and a second display substrate including a first display element, a second display element, and a third display element respectively overlapping the first pixel area, the second pixel area, and the third pixel area, wherein the first display substrate includes: a base substrate; a first color filter disposed on the base substrate to overlap the first pixel area and having a first color; a second color filter disposed on the base substrate to overlap the second pixel area and having a second color that is different from the first color; a third color filter disposed on the base substrate having a third color that is different from the first color and the second color, and including a filter portion overlapping the third pixel area and a light blocking portion overlapping the light blocking area; and a light blocking member disposed on the base substrate and wrapping around the light blocking portion to separate adjacent ones of the first color filter, the second color filter, and the third color filter from each other.

In an embodiment, a first opening corresponding to the first pixel area and a second opening corresponding to the second pixel area may be defined in the third color filter, and a first auxiliary opening corresponding to the first opening, a second auxiliary opening corresponding to the second opening, and a third auxiliary opening corresponding to the third pixel area may be defined in the light blocking member.

In an embodiment, the light blocking member may include: a base resin; and a yellow pigment dispersed in the base resin.

In an embodiment, the light blocking member may include: a base resin; and a black organic pigment dispersed in the base resin.

In an embodiment, the light blocking member may be directly disposed on the base substrate.

In an embodiment, each of the first display element, the second display element, and the third display element may output light having the third color, and the third color may be a blue color.

In an embodiment of the inventive concept, a display panel includes: a first display substrate including a first pixel area, a second pixel area, and a third pixel area, and a light blocking area that is adjacent to the first pixel area, the second pixel area, and the third pixel area; and a second display substrate including a first display element, a second display element, and a third display element respectively overlapping the first pixel area, the second pixel area, and the third pixel area, wherein the first display substrate includes: a base substrate; a first color filter disposed on the base substrate to overlap the first pixel area and having a first color; a second color filter disposed on the base substrate to overlap the second pixel area and having a second color that is different from the first color; a third color filter disposed on the base substrate having a third color that is different from the first color and the second color, and including a filter portion overlapping the third pixel area and a light blocking portion overlapping the light blocking area; and a light blocking member disposed on the light blocking portion and containing a yellow pigment, wherein the light blocking member is spaced a predetermined distance from each of the first pixel area, the second pixel area, and the third pixel area by a predetermined distance on a plane of the first display substrate.

BRIEF DESCRIPTION OF THE FIGURES

The accompanying drawings are included to provide a further understanding of the inventive concept, and are incorporated in and constitute a part of the present specification. The drawings illustrate exemplary embodiments of the inventive concept of the present disclosure and, together with the detailed description, serve to explain principles of the inventive concept. In the drawings:

FIG. 3A is a plan view illustrating pixel areas of the display panel according to an embodiment of the inventive concept;

DETAILED DESCRIPTION

Figure 1A:
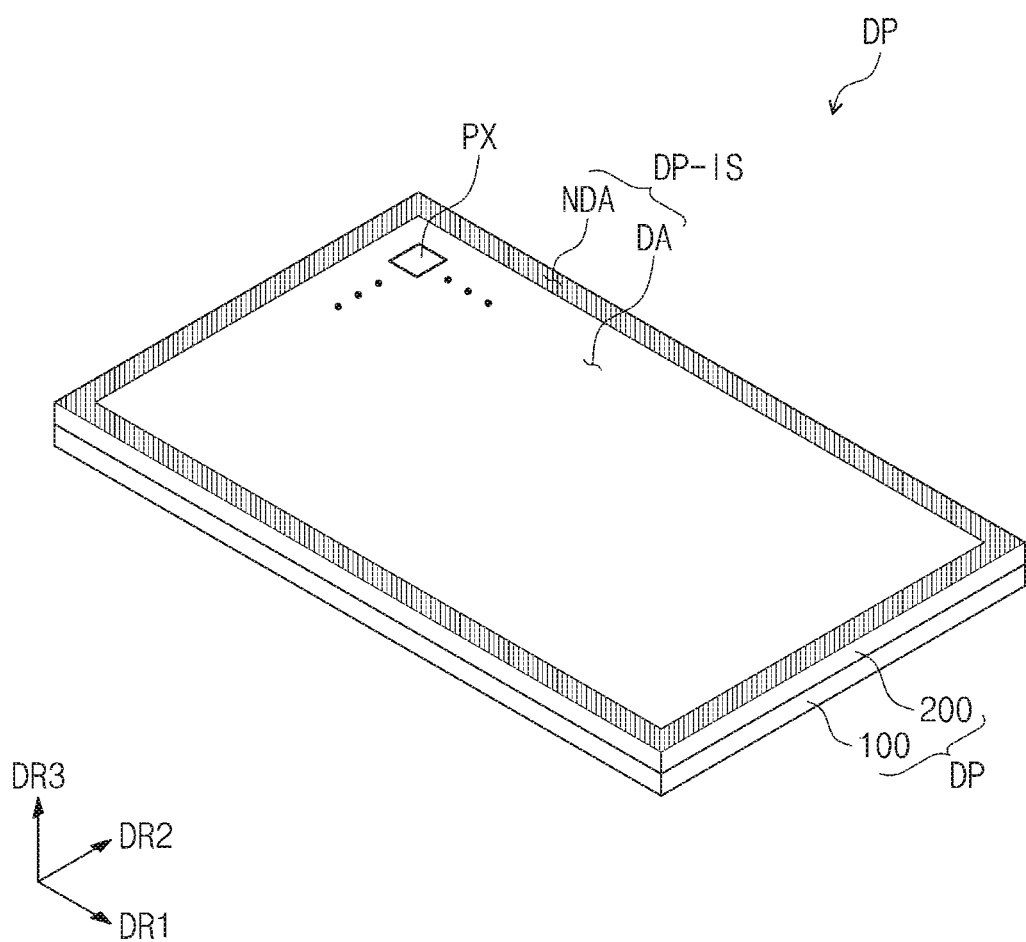
FIG. 1A is a perspective view of a display panel according to an embodiment of the inventive concept.

In the present specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. In addition, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

In addition, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which the present disclosure pertains. In addition, terms such as defined terms in commonly used dictionaries are to be interpreted as having meanings consistent with meaning in the context of the relevant art and are expressly defined herein unless interpreted in an ideal or overly formal sense.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, exemplary embodiments of the inventive concept will be described with reference to the accompanying drawings.

Figure 1B:
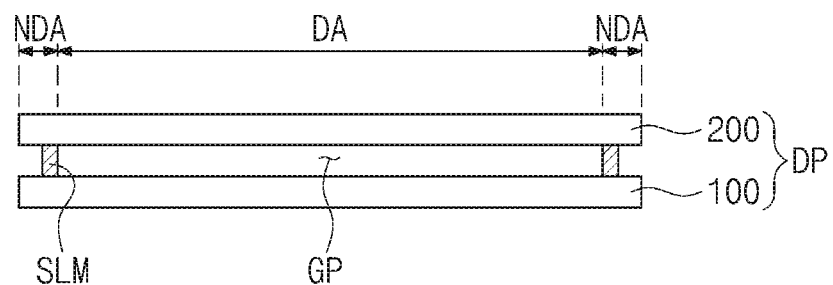
FIG. 1B is a cross-sectional view of the display panel shown in FIG. 1A.
Figure 1B:
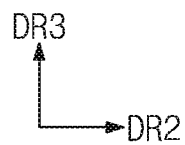

FIG. 1A is a perspective view of a display panel according to an embodiment of the inventive concept. FIG. 1B is a cross-sectional view of the display panel shown in FIG. 1A.

A display panel DP according to an embodiment of the inventive concept may be applied to a large electronic device such as a monitor and an external billboard or small and middle electronic devices such as a personal computer, a notebook computer, a personal digital terminal, a car navigation system, a game console, a smart phone, a tablet computer, and a camera. In addition, the above-described devices are exemplified merely as an exemplary embodiment, and thus, the display panel DP may be adopted for other electronic equipment without departing from the spirit and scope of the present disclosure.

The display panel DP may be one of a liquid crystal display panel, an electrophoretic display panel, a microelectromechanical system (MEMS) display panel, an electrowetting display panel, and an organic light emitting display panel, but is not specifically limited thereto.

Although not separately shown, the display panel DP may further include a chassis member or a molding member and also may further include a backlight unit depending on a type of the display panel DP.

Referring to FIG. 1A, the display panel DP may include a lower display substrate 100 and an upper display substrate 200 that faces the lower display substrate 100 and is spaced apart from the lower display substrate 100. As illustrated in FIG. 1A, the display panel DP may display an image through a display surface DP-IS. The display surface DP-IS is parallel to a surface defined by a first direction DR1 and a second direction DR2.

The display surface DP-IS may include a display area DA and a non-display area NDA. A pixel PX is disposed in the display area DA. The non-display area NDA is defined along an edge of the display surface DP-IS. A pad area PA (not shown) may be surrounded by or included in the non-display area NDA.

A normal direction of the display surface DP-IS, i.e., a thickness direction of the display panel DP is indicated as a third direction DR3. In the present disclosure, "when viewed on a plane, on the plane, or in a plan view" may mean a view taken in the third direction DR3. A front surface (or a top surface) and a rear surface (or a bottom surface) of each of layers or patterns, which will be described below, may be distinguished by the third direction DR3. However, directions indicated as the first, second, and third directions DR1, DR2, and DR3 are relative to each other and may be variously changed depending on an orientation of the layers or patterns with respective to a viewing position.

Although the display surface DP-IS having a planar surface is illustrated in the present embodiment, the inventive concept of the present disclosure is not limited thereto. The display panel DP may include a curved display surface or a solid display surface. The solid display surface may include a plurality of display areas that indicates different directions.

Referring to FIG. 1B, a predetermined cell gap GP may be defined between the upper display substrate 200 and the lower display substrate 100. The cell gap GP may be maintained by a sealant SLM for coupling the upper display substrate 200 to the lower display substrate 100. The sealant SLM may include an organic adhesion member or an inorganic adhesion member. The sealant SLM may include a frit.

Figure 2:
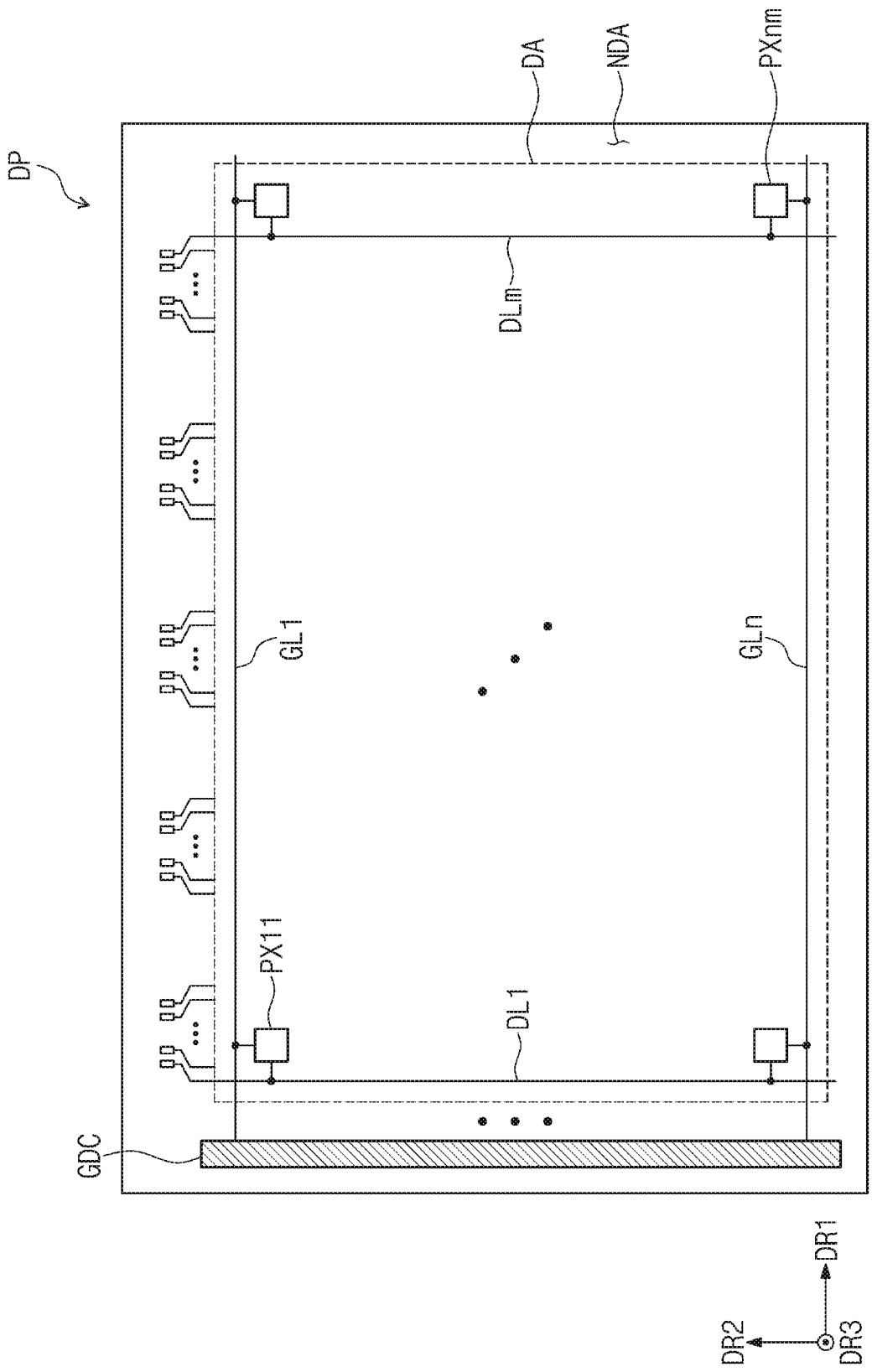
FIG. 2 is a plan view of the display panel according to an embodiment of the inventive concept.
Figure 3B:
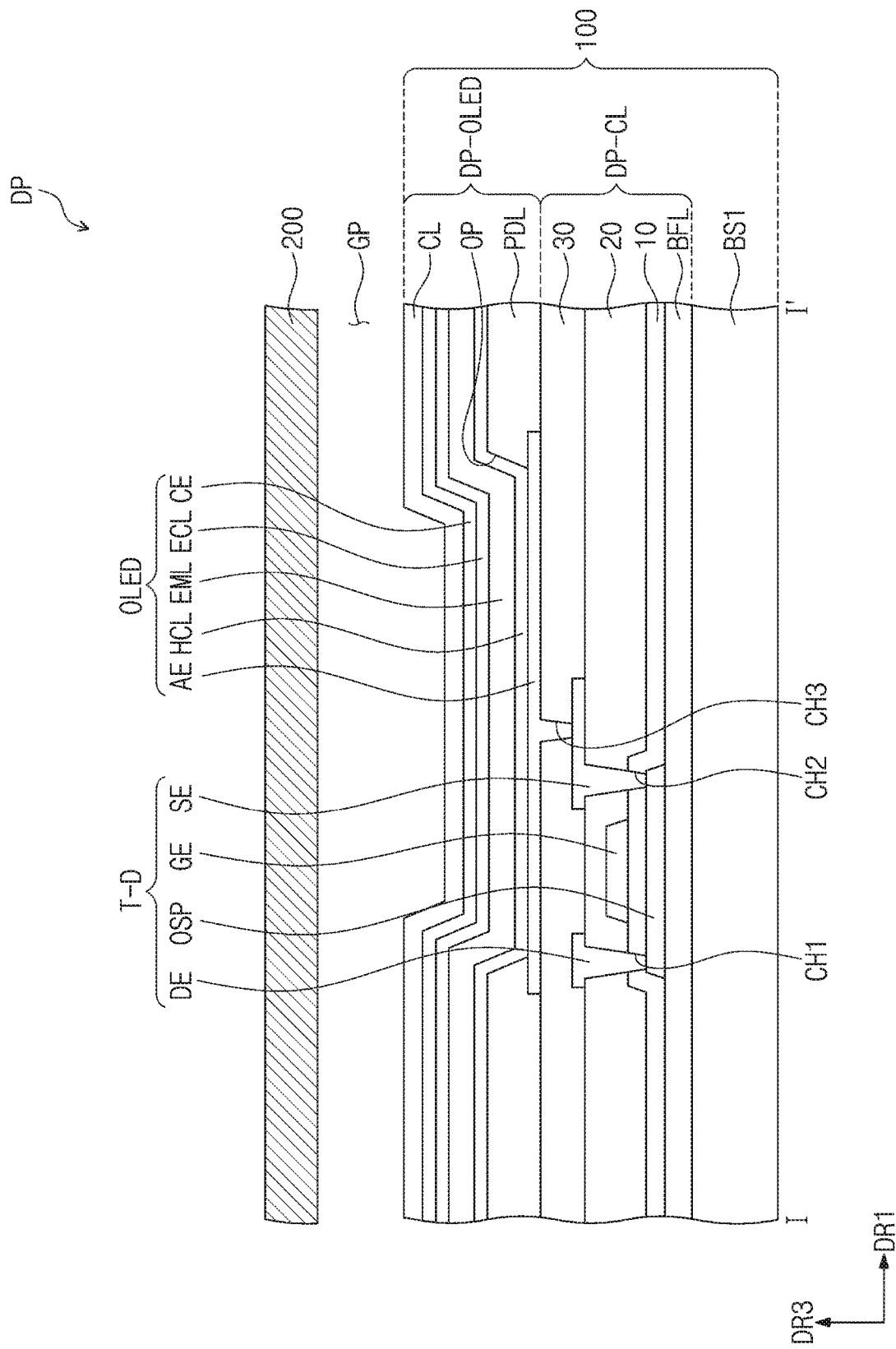
FIG. 3B is a cross-sectional view illustrating one pixel area of the display panel according to an embodiment of the inventive concept.

FIG. 2 is a plan view of the display panel according to an embodiment of the inventive concept. FIG. 3A is a plan view illustrating pixel areas of the display panel according to an embodiment of the inventive concept. FIG. 3B is a cross-sectional view illustrating one pixel area of the display panel according to an embodiment of the inventive concept.

FIG. 2 illustrates an arrangement relationship between signal lines GL1 to GLn and DL1 to DLm and pixels PX11 to PXnm on a plane. The signal lines GL1 to GLn and DL1 to DLm may include a plurality of gate lines GL1 to GLn and a plurality of data lines DL1 to DLm.

Each of the pixels PX11 to PXnm is connected to a corresponding gate line of the plurality of gate lines GL1 to GLn and a corresponding data line of the plurality of data lines DL1 to DLm, respectively. Each of the pixels PX11 to PXnm may include a pixel driving circuit and a display element. Additional signal lines may be provided on the display panel DP according to a configuration and a type of the pixel driving circuit.

The pixels PX11 to PXnm may be disposed in a matrix form, but the present disclosure is not limited thereto. For example, the pixels PX11 to PXnm may be disposed in the form of a PenTile matrix or a diamond.

A gate driving circuit GDC may be disposed in the non-display area NDA. The gate driving circuit GDC may be integrated with the display panel DP through an oxide silicon gate (OSG) process or an amorphous silicon gate (ASG) process.

FIG. 3A is a partial enlarged view of the display area DA including three pixel areas PXA-R, PXA-G, and PXA-B. The three pixel areas PXA-R, PXA-G, and PXA-B of FIG. 3A may be repeatedly disposed throughout the display area DA.

A light blocking area NPXA is disposed around the first to third pixel areas PXA-R, PXA-G, and PXA-B. The first to third pixel areas PXA-R, PXA-G, and PXA-B and the light blocking area NPXA may be substantially defined on the upper display substrate 200.

Although the first to third pixel areas PXA-R, PXA-G, and PXA-B having the same surface areas on the plane are exemplified in FIG. 3, the inventive concept of the present disclosure is not limited thereto. The first to third pixel areas PXA-R, PXA-G, and PXA-B may have surface areas that are different from each other or have at least two or more areas that are different from each other. In addition, although FIG. 3 shows that each of the first to third pixel areas PXA-R, PXA-G, and PXA-B has a rectangular shape with a rounded corner area on the plane, the inventive concept of the present disclosure is not limited thereto. For example, the first to third pixel areas PXA-R, PXA-G, and PXA-B may have other polygonal shapes on the plane. Alternatively, each of first to third pixel areas PXA-R, PXA-G, and PXA-B may have a square shape having a rounded corner area.

One of the first to third pixel areas PXA-R, PXA-G, and PXA-B may provide first color light having a wavelength band of a first color, the other one of the first to third pixel areas PXA-R, PXA-G, and PXA-B may provide second color light having a wavelength band of a second color that is different from the first color, and the remaining one of the first to third pixel areas PXA-R, PXA-G, and PXA-B may provide third color light having a wavelength band of a third color that is different from the first color and the second color.

According to an embodiment of the inventive concept, the first pixel area PXA-R may provide red light, the second pixel area PXA-G may provide green light, and the third pixel area PXA-B may provide blue light. A source light may be the blue light that is the third color light. The source light may be generated in a light source such as a backlight unit or generated by a display element such as a light emitting diode.

The light blocking area NPXA may set a boundary between the first to third pixel areas PXA-R, PXA-G, and PXA-B to prevent the colors from being mixed between the first to third pixel areas PXA-R, PXA-G, and PXA-B that are adjacent to each other. In addition, the light blocking area NPXA may block the source light.

According to one embodiment, the display panel DP shown in FIG. 3B may correspond to the second pixel area PXA-G of FIG. 3A including a driving transistor T-D and a light emitting element OLED. In FIG. 3B, the upper display substrate 200 is schematically illustrated.

Referring to FIG. 3B, the lower display substrate 100 includes a first base substrate BS1, a circuit element layer DP-CL disposed on the first base substrate BS1, and a display element layer DP-OLED disposed on the circuit element layer DP-CL.

The first base substrate BS1 may include a synthetic resin substrate or a glass substrate. The circuit element layer DP-CL may include at least one insulation layer and a circuit element. The circuit element may include signal line and a driving circuit of a pixel. The circuit element layer DP-CL may be formed through a series of processes of forming an insulation layer, a semiconductor layer, and a conductive layer by coating or deposition and patterning the insulation layer, the semiconductor layer, and the conductive layer by a photolithography process.

In the present embodiment, the circuit element layer DP-CL may include a buffer layer BFL, a first insulation layer 10, a second insulation layer 20, and a third insulation layer 30. Each of the first insulation layer 10 and the second insulation layer 20 may be an inorganic layer, and the third insulation layer 30 may be an organic layer.

The driving transistor T-D includes a semiconductor pattern OSP, a control electrode GE, an input electrode DE, and an output electrode SE. First, second, and third through-holes CH1, CH2, and CH3 penetrating through at least one or more of the first insulation layer 10, the second insulation layer 20, and the third insulation layer 30 are exemplarily illustrated as a non-limiting example.

The display element layer DP-OLED includes a light emitting element OLED. The light emitting element OLED may generate the above-described source light. The light emitting element OLED includes a first electrode AE, a hole control layer HCL, a second electrode CE, an electron control layer ECL, and a light emitting layer EML that is disposed between the first electrode AE and the second electrode CE. In the present embodiment, the light emitting element OLED may include an organic light emitting diode. The display element layer DP-OLED further includes a pixel defining layer PDL that defines a pixel area (e.g., the first to third pixel areas PXA-R, PXA-G, and PXA-B of FIG. 3A). For example, the pixel defining layer PDL may be an organic layer.

The first electrode AE is disposed on the third insulation layer 30. The first electrode AE is connected to the output electrode SE of the driving transistor T-D through the third through-hole CH3 that passes through the third insulation layer 30. An opening OP is defined in the pixel defining layer PDL. The opening OP of the pixel defining layer PDL exposes at least a portion of the first electrode AE.

The hole control layer HCL, the light emitting layer EML, and the electron control layer ECL may be commonly disposed on the first electrode AE and the pixel defining layer PDL. The hole control layer HCL, the light emitting layer EML, and the electron control layer ECL may be commonly disposed in the first to third pixel areas PXA-R, PXA-G, and PXA-B (see FIG. 3A).

The hole control layer HCL may include a hole transport layer and may further include a hole injection layer. According to one embodiment, the light emitting layer EML may generate blue light. The blue light may include a wavelength of about 410 nm to about 480 nm. An emission spectrum of the blue light may have a maximum peak within a wavelength of about 440 nm to about 460 nm. The electron control layer ECL may include an electron transport layer and may further include an electron injection layer. The light emitting layer EML may have a tandem structure or a single layer structure.

The second electrode CE is disposed on the electronic control layer ECL. The second electrode CE may be commonly disposed in the first to third pixel areas PXA-R, PXA-G, and PXA-B (see FIG. 3A). The second electrode CE may have a surface area greater than that of the first electrode AE. A cover layer CL protecting the second electrode CE may be disposed on the second electrode CE. The cover layer CL may include an organic material or an inorganic material. In some embodiments, the cover layer CL may be omitted.

Although not separately shown, the lower display substrate 100 may include first to third display elements respectively corresponding to the first to third pixel areas PXA-R, PXA-G, and PXA-B of FIG. 3A. Each of the first to third display elements may have the same laminated structure. In addition, each of the first to third display elements may have the same laminated structure as the light emitting element OLED shown in FIG. 3B.

Figure 4:
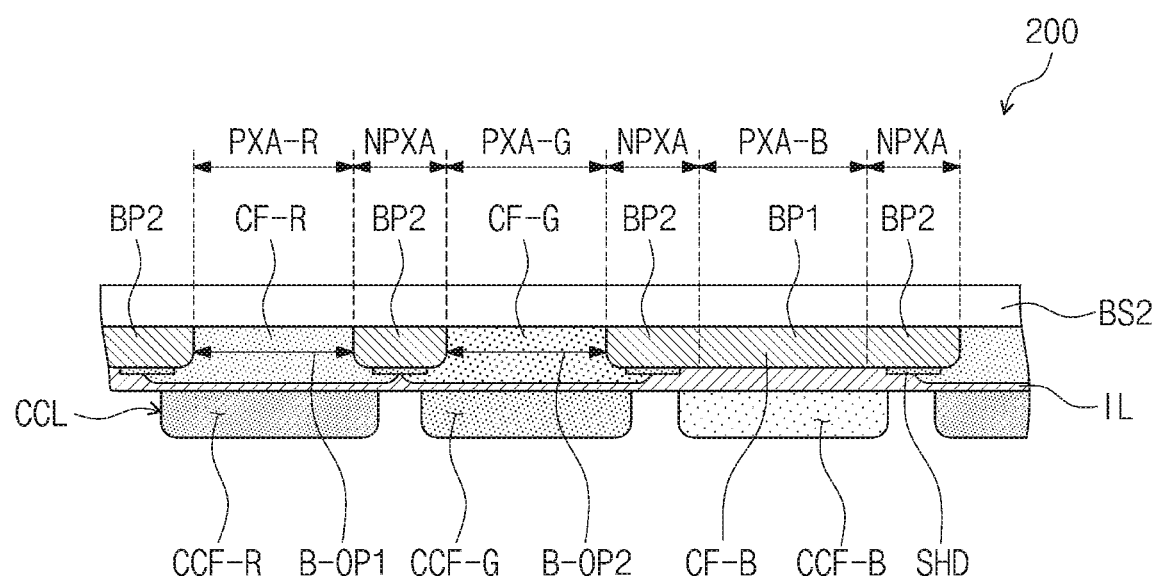
FIG. 4 is a cross-sectional view of an upper display substrate according to an embodiment of the inventive concept.
Figure 5A:
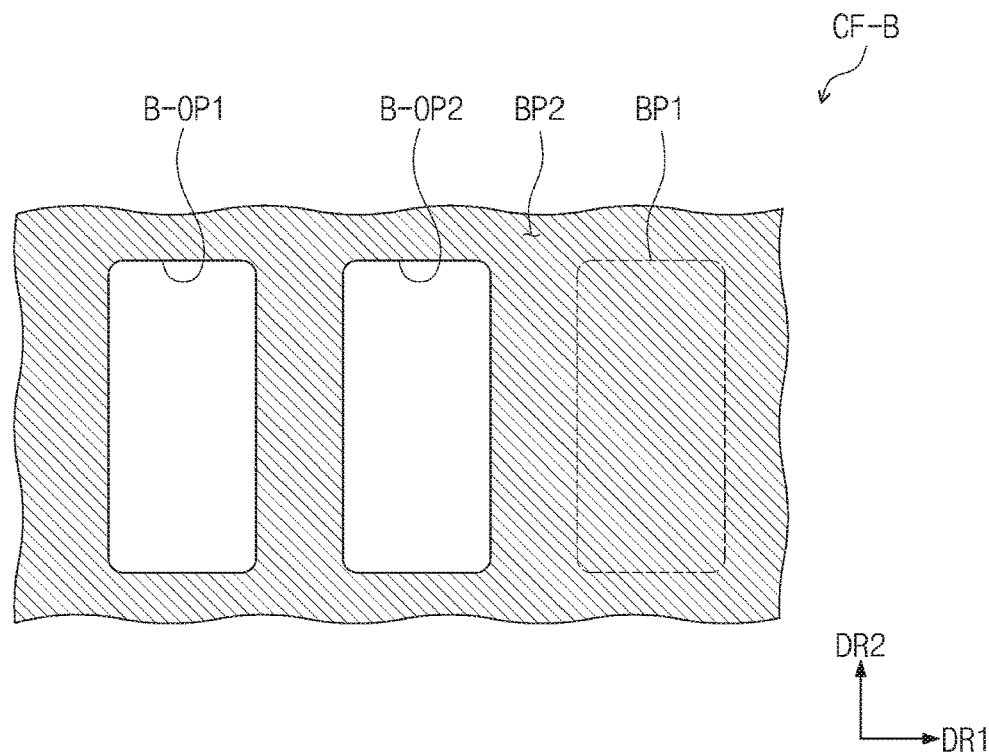
FIG. 5A is a plan view illustrating a laminated structure of the upper display substrate according to an embodiment of the inventive concept.
Figure 5B:
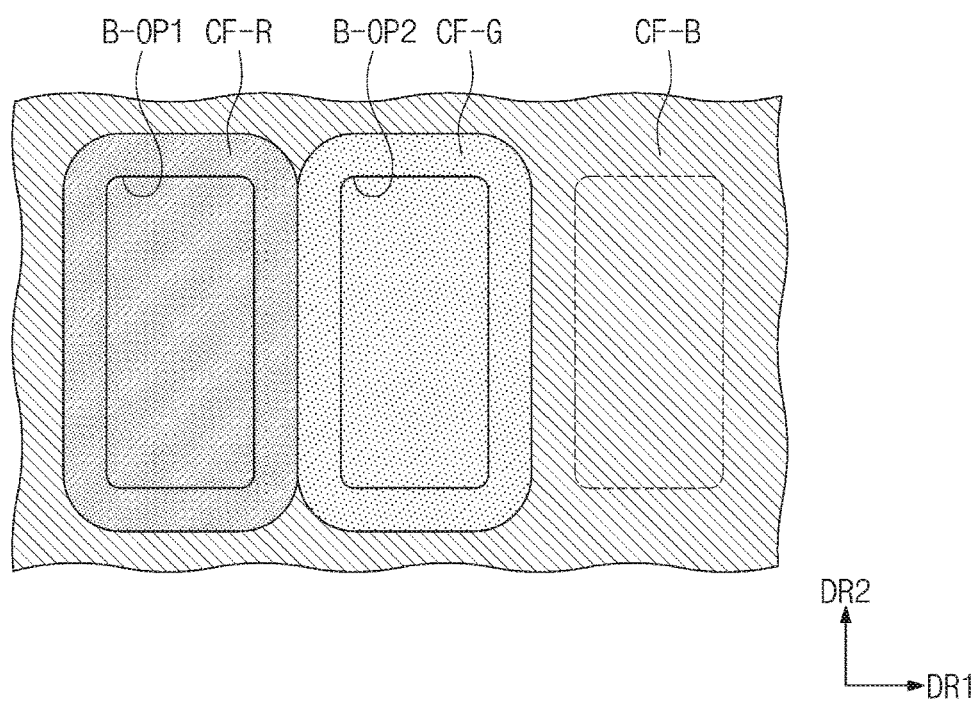
FIG. 5B is a plan view illustrating a laminated structure of the upper display substrate according to an embodiment of the inventive concept.
Figure 5C:
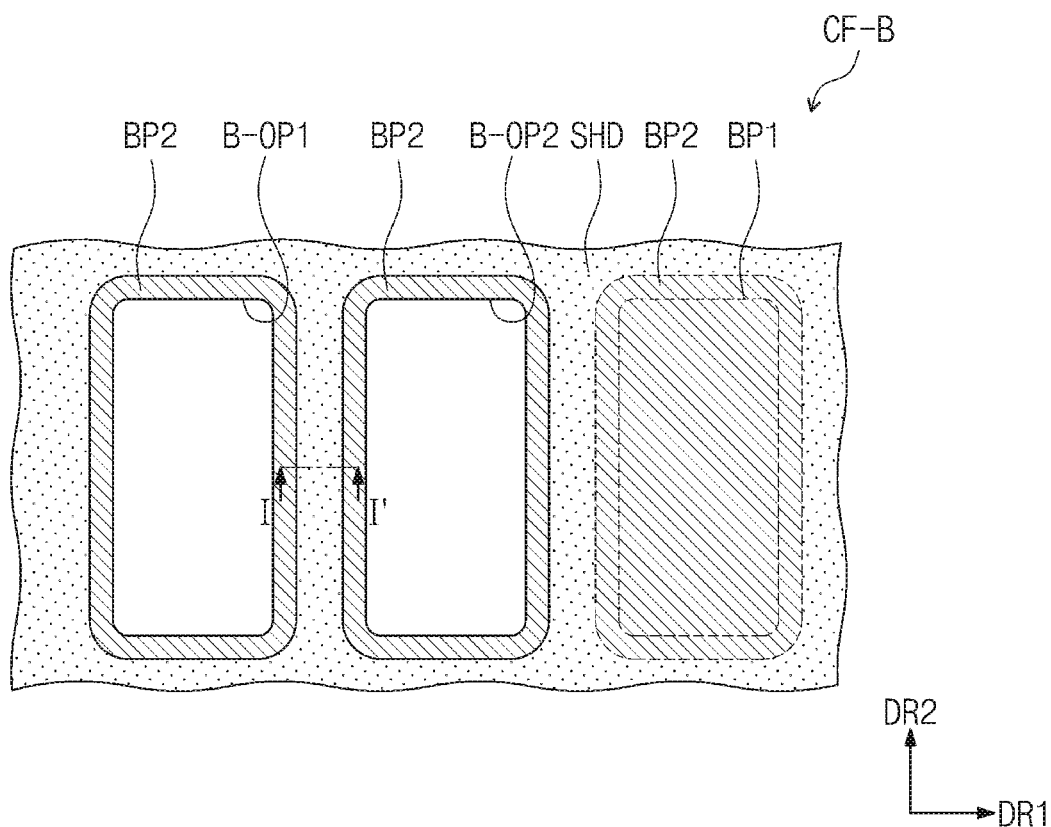
FIG. 5C is a plan view illustrating a laminated structure of the upper display substrate according to an embodiment of the inventive concept.
Figure 5D:
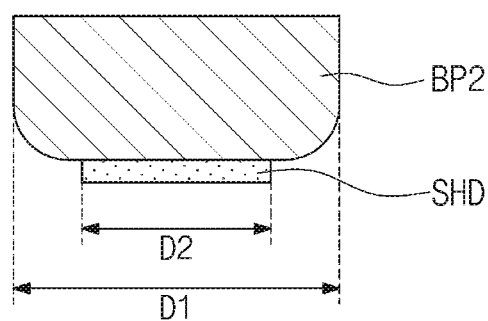
FIG. 5D is a cross-sectional view taken along line I-I' of FIG. 5C according to an embodiment of the inventive concept.
Figure 6:
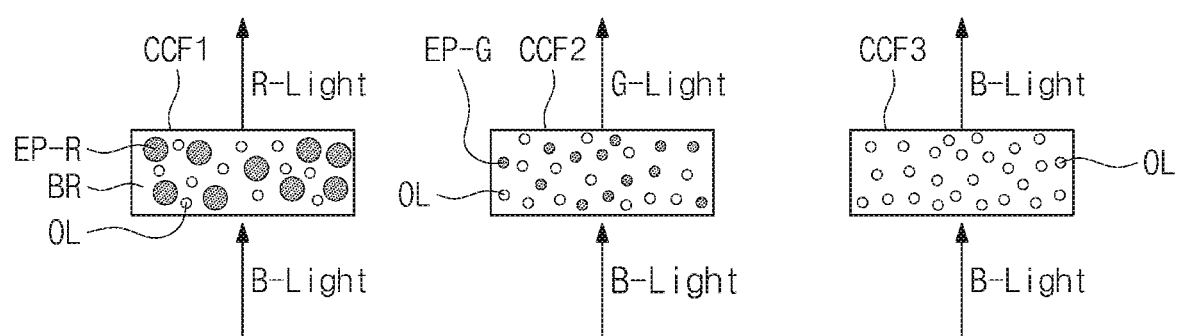
FIG. 6 is a schematic view illustrating light characteristics of various color conversion parts and a color transmission part according to an embodiment of the inventive concept.

FIG. 4 is a cross-sectional view of the upper display substrate according to an embodiment of the inventive concept. FIG. 5A is a plan view illustrating a laminated structure of the upper display substrate according to an embodiment of the inventive concept. FIG. 5B is a plan view illustrating a laminated structure of the upper display substrate according to an embodiment of the inventive concept. FIG. 5C is a plan view illustrating a laminated structure of the upper display substrate according to an embodiment of the inventive concept. FIG. 5D is a cross-sectional view taken along line I-I' of FIG. 5C according to an embodiment of the inventive concept. FIG. 6 is a schematic view illustrating light characteristics of various conversion parts and a color transmission according to an embodiment of the inventive concept.

Referring to FIG. 4, the upper display substrate 200 includes a second base substrate BS2, first, second, and third color filters CF-R, CF-G, and CF-B, an insulation layer IL, and a light control layer CCL. Although not separately shown, according to another embodiment of the inventive concept, when the display elements corresponding to the first to third pixel areas PXA-R, PXA-G, and PXA-B generate light having different colors, the light control layer CCL may be omitted.

The first to third color filters CF-R, CF-G, and CF-B may be disposed on the second base substrate BS2. According to an embodiment, the first to third color filters CF-R, CF-G, and CF-B may be directly disposed on the second base substrate BS2.

According to an embodiment of the inventive concept, the third color filter CF-B may be provided at a refractive index similar to that of the second base substrate BS2 rather than that of each of the first color filter CF-R and the second color filter CF-G. As a result, external light entering from the outside may be incident into the third color filter CF-B after passing through the second base substrate BS2. Thus, external light reflection occurring on an interface between the second base substrate BS2 and the third color filter CF-B may be reduced.

In detail, the third color filter CF-B may be divided into a filter portion BP1 serving as a color filter and a light blocking portion BP2 serving as a light blocking pattern. The filter portion BP1 may overlap the third pixel area PXA-B, and the light blocking portion BP2 may overlap the light blocking area NPXA.

Referring to FIG. 5A, an organic layer having a blue color may be formed on one surface of the second base substrate BS, and then, the organic layer may be exposed and developed to form the third color filter CF-B having a first opening B-OP1 and a second opening B-OP2. That is, the filter portion BP1 and the light blocking portion BP2 may be provided as a single body.

Referring to FIGS. 5B, the first color filter CF-R is disposed in the first opening B-OP1 defined in the third color filter CF-B shown in FIG. 5A. In a plan view, the first color filter CF-R may entirely cover the first opening B-OP1 and extend to cover at least a portion of the light blocking portion BP2. The second color filter CF-G is disposed in the second opening B-OP2 defined in the third color filter CF-B. In the plan view, the second color filter CF-G may entirely cover the second opening B-OP2 and extend to cover at least a portion of the light blocking portion BP2.

The first color filter CF-R and the second color filter CF-G that are disposed on the light blocking portion BP2 may contact each other. However, the inventive concept of the present disclosure is not limited thereto. For example, the first color filter CF-R disposed on the light blocking portion BP2 may be spaced a predetermined distance from the second color filter CF-G in the plan view.

Referring again to FIG. 4, a light blocking member SHD may be disposed on the light blocking portion BP2 of the third color filter CF-B. An edge portion of each of the first color filter CF-R and the second color filter CF-G may be disposed on the light blocking member SHD. That is, the edge portion of each of the first and second color filters CF-R and CF-G and the light blocking member SHD may absorb the external light transmitted through the light blocking portion BP2 to prevent the colors from being mixed between the first to third pixel areas PXA-R, PXA-G, and PXA-B that are adjacent to each other. In addition, the light blocking member SHD may absorb a portion of light outputted from the light control layer CCL.

According to an embodiment of the inventive concept, the light blocking member SHD may be disposed on the light blocking portion BP2 on the second base substrate BS2 as being spaced from the first to third pixel areas PXA-R, PXA-G, and PXA-B by a predetermined distance.

Referring to FIGS. 5C and 5D, the light blocking member SHD may surround the light blocking portion BP2 and be spaced apart from each of the first opening B-OP1 and the second opening B-OP2 on the second base substrate BS2. Particularly, a first width D1 between the first opening B-OP1 and the second opening B-OP2 may be greater than a second width D2 of the light blocking member SHD in the first direction DR1. Since the second width D2 is less than the first width D1, the first color filter CF-R and the second color filter CF-G may be easily disposed on the light blocking portion BP2 and the light blocking member SHD.

According to an embodiment, the light blocking member SHD may be provided as a black light blocking layer. Particularly, the light blocking member SHD may include a base resin and a black organic pigment that is dispersed in the base resin. The light blocking member SHD including the black organic pigment may have a relatively low light reflectance with respect to light incident from the outside when compared to a carbon black that is another example of the light blocking member SHD according to another embodiment. Thus, the external light reflection occurring at the interface between the second base substrate BS2 and the light blocking member SHD may be reduced.

According to another embodiment, the light blocking member SHD may be provided as a yellow light blocking layer. Particularly, the light blocking member SHD may include a base resin and a yellow pigment that is dispersed in the base resin.

Referring again to FIG. 4, the insulation layer IL may be disposed on the second base substrate BS2 to cover the first to third color filters CF-R, CF-G, and CF-B and the light blocking member SHD.

The light control layer CCL is disposed on the insulation layer IL. The light control layer CCL may include a plurality of light emitting bodies that can absorb the third color light that is outputted from the display element layer DP-OLED (see FIG. 3B) and emit light having a color different from the third color.

The light control layer CCL includes a first color conversion part CCF-R, a second color conversion part CCF-G, and a color transmission part CCF-B. The first color conversion part CCF-R may overlap the first pixel area PXA-R to absorb the third color light and emit light having the first color that is different from the third color. For example, the first color may be a red color.

The second color conversion part CCF-G may overlap the second pixel area PXA-G to absorb the third color light and emit light having the second color that is different from the first color and the third color. For example, the second color may be a green color.

The color transmission part CCF-B may overlap the third pixel area PXA-B to transmit the third color light without converting it to a different color such as the first color light and the second color light.

Referring to FIG. 6, a first light emitting body EP-R may absorb the third color light (blue light) to emit the first color light (red light), and a second light emitting body EP-G may absorb the third color light to emit the second color light (green light). The color transmission part CCF-B may correspond to a portion of the light control layer CCL that does not include any light emitting body. The color transmission part CCF-B may correspond to a portion of the light control layer CCL that transmits the third color light.

In addition, each of the first color conversion part CCF-R, the second color conversion part CCF-G, and the color transmission part CCF-B may include a base resin BR. The base resin BR may be a polymer resin. Examples of the base resin BR may include an acrylic-based resin, a urethane-based resin, and a silicon-based resin, and an epoxy-based resin. The base resin BR may be a transparent resin.

In addition, each of the first color conversion part CCF-R, the second color conversion part CCF-G, and the color transmission part CCF-B may include scattered particles OL. The scattered particles OL may be titanium dioxide ($TiO_2$) or silica-based nano particles. The scattered particles OL may scatter light emitted from the first and second light emitting bodies EP-R and EP-G, and the scattered light may emit to the outside of the corresponding color conversion part CCF-R or CCF-G. In addition, the scattered particles OL included in the color transmission part CCF-B may scatter the provided light (blue light), and the scattered light may emit to the outside of the color transmission part CCF-B.

The first and second light emitting bodies EP-R and EP-G included in the color control layer CCL may be fluorescent substances or quantum dots. In other words, in an embodiment, the color control layer CCL may include at least one of the fluorescent substances or the quantum dots as the light emitting bodies EP-R and EP-G.

For example, the fluorescent substances used as the light emitting bodies EP-R and EP-G may be inorganic fluorescent substances. In the display device DD according to an embodiment, the fluorescent substances used as the light emitting bodies EP-R and EP-G may be a red fluorescent substance and a green fluorescent substance.

The green fluorescent substance may include at least one selected from a group consisting of $YBO_3$:$Ce^{3+}$,$Tb^{3+}$, $BaMgAl_{10}O_{17}$:$Eu^{2+}$, $Mn^{2+}$, $(Sr,Ca,Ba)(Al,Ga)_2S_4$:$Eu^{2+}$; $ZnS$:$Cu,Al$, $Ca_8Mg(SiO_4)_4Cl_2$: $Eu^{2+},Mn^{2+}$; $Ba_2SiO_4$:$Eu^{2+}$; $(Ba,Sr)_2SiO_4$:$Eu^{2+}$; $Ba_2(Mg, Zn)Si_2O_7$:$Eu^{2+}$; $(Ba, Sr)Al_2O_4$:$Eu^{2+}$, $Sr_2Si_3O_8 \cdot 2SrCl_2$:$Eu^{2+}$.

The red fluorescent substance may include at least one selected from a group consisting of $(Sr,Ca,Ba,Mg)P_2O_7$: $Eu^{2+}$, $Mn^{2+}$, $CaLa_2S_4$:$Ce^{3+}$; $SrY_2S_4$: $Eu^{2+}$, $(Ca,Sr)S$: $Eu^{2+}$, $SrS$:$Eu^{2+}$, $Y_2O_3$: $Eu^{3+},Bi^{3+}$; $YVO_4$: $Eu^{3+},Bi^{3+}$; $Y_2O_2S$: $Eu^{3+},Bi^{3+}$; $Y_2O_2S$: $Eu^{3+}$.

However, the kinds of the fluorescent substances used in the color control layer CCL are not limited to the materials described above. In other words, the fluorescent substances may use other known fluorescent substances in addition to the fluorescent substance materials described above.

In other embodiments, the light emitting bodies EP-R and EP-G included in the color control layer CCL may be the quantum dots. The quantum dot may be formed of a group II-VI compound, a group III-V compound, a group IV-VI compound, a group IV element, a group IV compound, or any combination thereof.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and any mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be selected from a group consisting of a binary compound selected from a group consisting of GaN, GaP, GaAs, GaSb, AlN, AlP, AlAs, AlSb, InN, InP, InAs, InSb, and any mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The group IV-VI compound may be selected from a group consisting of a binary compound selected from a group consisting of SnS, SnSe, SnTe, PbS, PbSe, PbTe, and any mixture thereof; a ternary compound selected from a group consisting of SnSeS, SnSeTe, SnSTe, PbSeS, PbSeTe, PbSTe, SnPbS, SnPbSe, SnPbTe, and any mixture thereof; and a quaternary compound selected from a group consisting of SnPbSSe, SnPbSeTe, SnPbSTe, and any mixture thereof. The group IV element may be selected from a group consisting of Si, Ge, and a mixture thereof. The group IV compound may be a binary compound selected from a group consisting of SiC, SiGe, and a mixture thereof.

In these cases, the binary compound, the ternary compound, or the quaternary compound may exist in the quantum dot with a substantially uniform concentration. Alternatively, a concentration of the binary compound, the ternary compound or the quaternary compound in a portion of the quantum dot may be different from that of the binary compound, the ternary compound or the quaternary compound in another portion of the quantum dot.

The quantum dot may have a core-shell structure including a core and a shell surrounding the core. Alternatively, the control part may have a core/shell structure in which one quantum dot surrounds another quantum dot. An interface of the core and the shell may have a concentration gradient in which a concentration of an element existing in the shell becomes progressively less toward a center.

The quantum dot may be a nano-sized particle. The quantum dot may have a full width of half maximum (FWHM) of an emission wavelength spectrum that is about 45 nm or less (in particular, about 40 nm or less, and in more particular, about 30 nm or less), and color purity and/or color reproduction can be improved in the range. In addition, light emitted through the quantum dot may be emitted in all directions, and thus a wide viewing angle can be improved or realized.

Furthermore, a shape of the quantum dot may be a general shape known in the art but is not limited to a specific shape. For example, the quantum dot may have a spherical shape, a pyramidal shape, a multi-arm shape, a cubic nanoparticle shape, a nanotube shape, a nanowire shape, a nanofiber shape, or a nano-plate particle shape. According to an embodiment of the inventive concept, the light emitted from the quantum dot may vary in color according to a particle size of the quantum dot. When the first light emitting body EP-R and the second light emitting body EP-G are the quantum dots, a particle size of the first light emitting body EP-R and a particle size of the second light emitting body EPG may be different from each other. For example, the first light emitting body EP-R may have a particle size greater than that of the second light emitting body EP-G. Here, the first light emitting body EP-R may emit light having a wavelength shorter than that emitted from the second light emitting body EP-G.

Figure 7A:
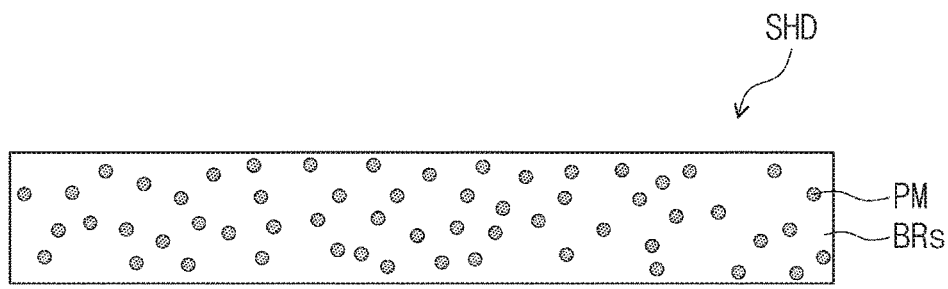
FIG. 7A is a cross-sectional view of a light blocking member according to an embodiment of the inventive concept.
Figure 7B:
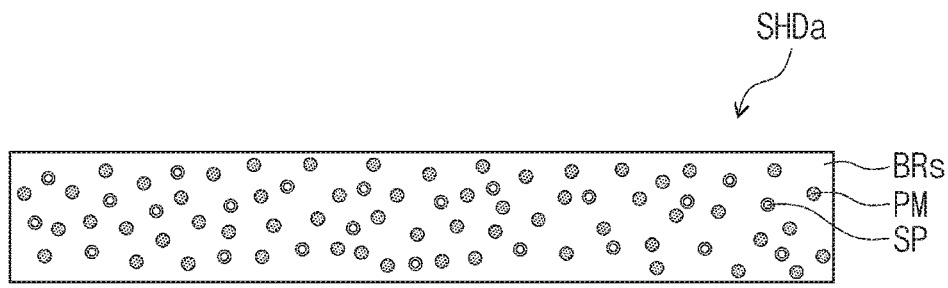
FIGS. 7B, 7C, and 7D are cross-sectional views of a light blocking member according to another embodiment of the inventive concept.
Figure 7C:
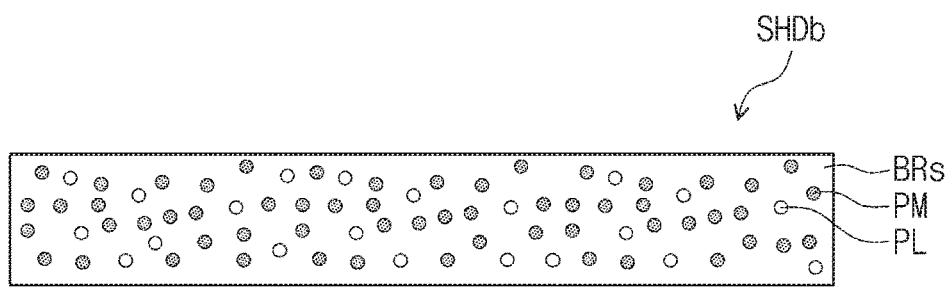
Figure 7D:
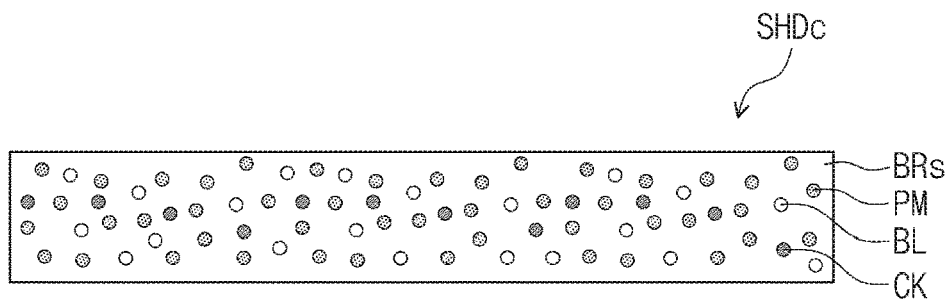
Figure 8:
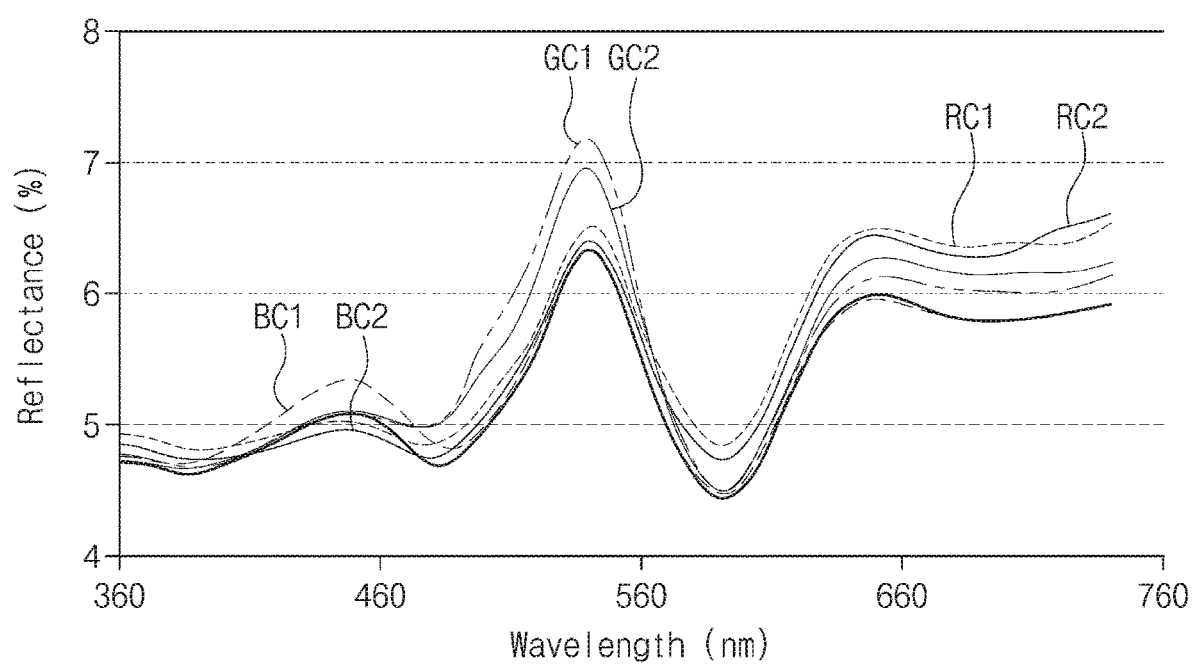
FIG. 8 is a graph illustrating a reflectance of external light transmitted to the light blocking member according to an embodiment of the inventive concept.

FIG. 7A is a cross-sectional view of the light blocking member according to an embodiment of the inventive concept. FIGS. 7B, 7C, and 7D are cross-sectional views of a light blocking member according to another embodiment of the inventive concept. FIG. 8 is a graph illustrating a reflectance of external light transmitted to the light blocking member according to an embodiment of the inventive concept.

Referring to FIG. 7A, the light blocking member SHD may include a base resin BRs and a black organic pigment PM that is dispersed in the base resin BRs. The base resin BRs may be a polymer resin. Examples of the base resin BRs may include an acrylic-based resin, a urethane-based resin, and a silicon-based resin, and an epoxy-based resin. The base resin BRs may be a transparent resin. Since the black organic pigment PM is dispersed the base resin BRs, the light blacking member SHD may be provided as a black light emitting layer.

Referring to FIG. 7B, the light blocking member SHDa may further include hollow silica SP in addition to the base resin BRs and the black organic pigment PM. The hollow silica SP may be dispersed in the base resin BRs to reduce a refractive index of the light blocking member SHDa. For example, the light blocking member SHDa containing the hollow silica SP may have a refractive index similar to that of the light blocking portion BP2 of the third color filter CF-B (see FIG. 4). As a result, the light reflectance at the interface between the light blocking portion BP2 (see FIG. 4) and the light blocking member SHDa containing the hollow silica SP may be reduced.

Referring to FIG. 7C, a light blocking member SHDb may further include perylene PL in addition to the base resin BRs and the black organic pigment PM. The perylene PL dispersed into the base resin BRs may absorb the blue light. The light blocking member SHDb may be disposed on the light blocking portion BP2 having the third color. In this case, the perylene PL may absorb the external light having a wavelength band of the third color and passing through the light blocking portion BP2.

Referring to FIG. 7D, a light blocking member SHDc may the base resin BRs, the black organic pigment PM, a blue pigment BL, and a carbon black CK. The black organic pigment PM dispersed in the base resin BRs is provided at a first weight, the blue pigment BL dispersed in the base resin BRs is provided at a second weight, and the carbon black CK dispersed in the base resin BRs is provided at a third weight.

According to an embodiment, the first weight may be greater than the second weight, and the second weight may be greater than the third weight. That is, the black organic pigment PM, the blue pigment BL, and the carbon black CK are dispersed in the base resin BRs in a decreasing order of weight. For example, a composition ratio of the black organic pigment PM, the blue pigment BL, and the carbon black CK may be about 15:5:3.

That is, in the light blocking member SHDc of FIG. 7D, the blue pigment BL and the carbon black CK in addition to the black organic pigment PM are dispersed in the base resin BRs. In this case, similarly, the light reflectance at the interface between the light blocking portion BP2 and the light blocking member SHDc may be reduced.

FIG. 8 illustrates a state in which the external light reflection is reduced when one of the light blocking members described with reference to FIGS. 7A to 7D is used. A horizontal axis denotes a wavelength (nm) of light, and a vertical axis denotes reflectance of light (%).

With respect to the third color light (blue light), the light blocking member containing the carbon black CK has a first reflectance BC1. In comparison, the light blocking member containing the black organic pigment PM according to the inventive concept may have a second reflectance BC2 that is greater than the first reflectance BC1 with respect to the third color light.

With respect to the second color light (green light), the light blocking member containing the carbon black CK has a first reflectance GC1. In comparison, the light blocking member containing the black organic pigment PM according to the inventive concept may have a second reflectance GC2 that is greater than the first reflectance GC1 with respect to the second color light.

With respect to the first color light (red light), the light blocking member containing the carbon black CK has a first reflectance RC1. in comparison, the light blocking member containing the black organic pigment PM according to the inventive concept may have a second reflectance RC2 that is greater than the first reflectance RC1 with respect to the first color light.

Figure 9:
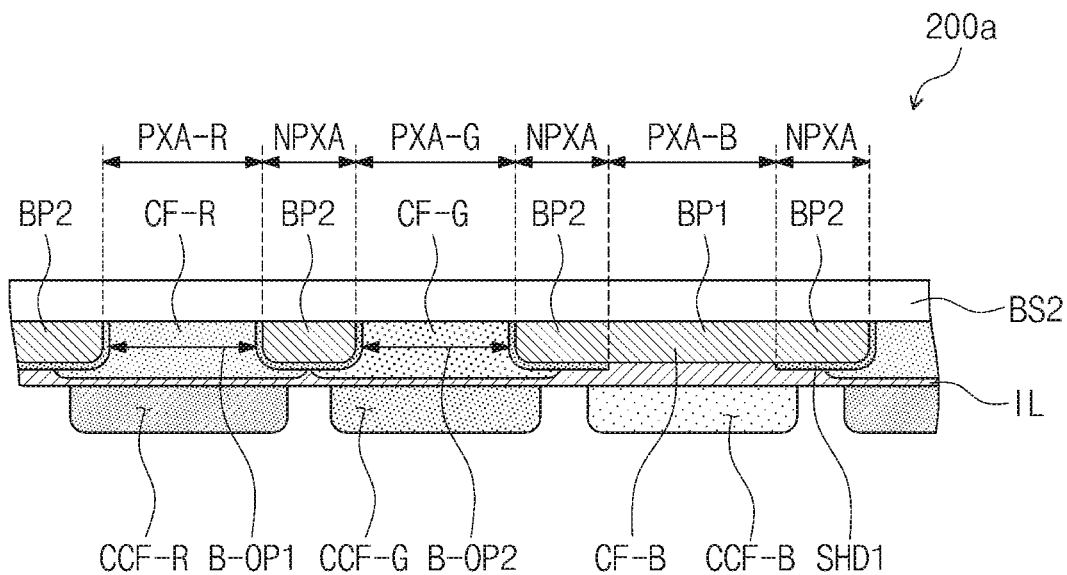
FIG. 9 is a cross-sectional view of an upper display substrate according to another embodiment of the inventive concept.
Figure 10:
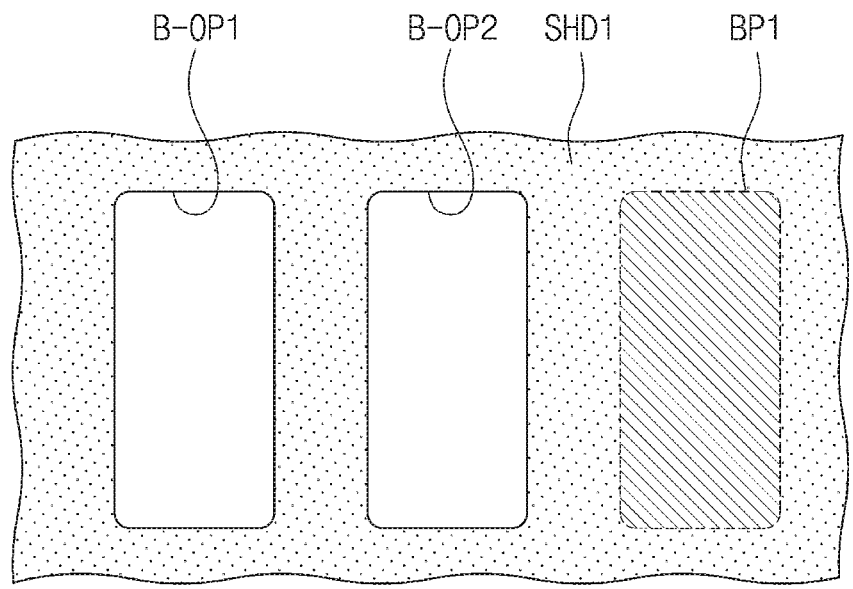
FIG. 10 is a plan view of the light blocking member of FIG. 9.

FIG. 9 is a cross-sectional view of an upper display substrate according to another embodiment of the inventive concept. FIG. 10 is a plan view of the light blocking member of FIG. 9.

An upper display substrate 200a of FIG. 9 is substantially the same as the upper display substrate 200 of FIG. 4 except for a structure of a light blocking member. Thus, the structure of the light blocking member will be mainly described with reference to FIG. 9, and descriptions of commonly included elements and layers will be omitted for convenience of description.

Referring to FIG. 9, first to third color filters CF-R, CF-G, and CF-B are directly disposed on a second base substrate BS2. The first color filter CF-R and the second color filter CF-G are disposed in a first opening B-OP1 and a second opening B-OP2 that are defined by the third color filter CF-B.

According to an embodiment of the inventive concept, a light blocking member SHD1 may wrap around a light blocking portion BP2 to separate the adjacent ones of the first to third color filters CF-R, CF-G, and CF-B from each other, and at least a portion of the light blocking member SHD1 may be directly disposed on the second base substrate BS2. For example, the portion of the light blocking portion BP2 may be directly disposed on a bottom surface of the second base substrate BS2, and the light blocking member SHD1 may be disposed on a side surface and a bottom surface of the light blocking portion BP2.

As illustrated in FIG. 10, the light blocking member SHD1 may be disposed on the light blocking portion BP2 to surround the first opening B-OP1, the second opening B-OP2, and a filter portion BP1 on the upper display substrate 200a in a plan view. A first auxiliary opening corresponding to the first opening B-OP1, a second auxiliary opening corresponding to the second opening B-OP2, and a third auxiliary opening corresponding to the third pixel area PXA-B may be defined in/on the light blocking member SHD1. Here, the third pixel area PXA-B may correspond to the filter portion BP1.

According to an embodiment, the light blocking member SHD1 may be provided as a black light blocking layer. Particularly, the light blocking member SHD1 may include a base resin and a black organic pigment that is dispersed in the base resin. The light blocking member SHD1 including the black organic pigment may have a relatively low light reflectance with respect to the external light when compared to a light blocking member including the carbon black. Thus, the external light reflection occurring at an interface between the second base substrate BS2 and the light blocking member SHD1 may be reduced.

According to an embodiment, the light blocking member SHD1 may be provided as a yellow light blocking layer. Particularly, the light blocking member SHD1 may include a base resin and a yellow pigment that is dispersed in the base resin. The light blocking member SHD1 including the yellow pigment may have a relatively low light reflectance with respect to the external light when compared to a light blocking member including the carbon black.

In addition, since the light blocking member SHD1 wraps around the light blocking portion BP2 to separate the adjacent ones of the first to third color filters CF-R, CF-G, and CF-B from each other, light leakage that may occur due to the light outputted from the light control layer CCL may be reduced. For example, first color light outputted from the first color conversion part CCF-R or blue light that does not react with the first light emitting body EP-R contained in the first color conversion part CCF-R may be leaked to the outside through the light blocking portion BP2. However, the light blocking member SHD1 may wrap around the light blocking portion BP2 to separate the adjacent ones of the first to third color filters CF-R, CF-G, and CF-B from each other and prevent the first color light or the blue light from leaking to the outside.

Figure 11:
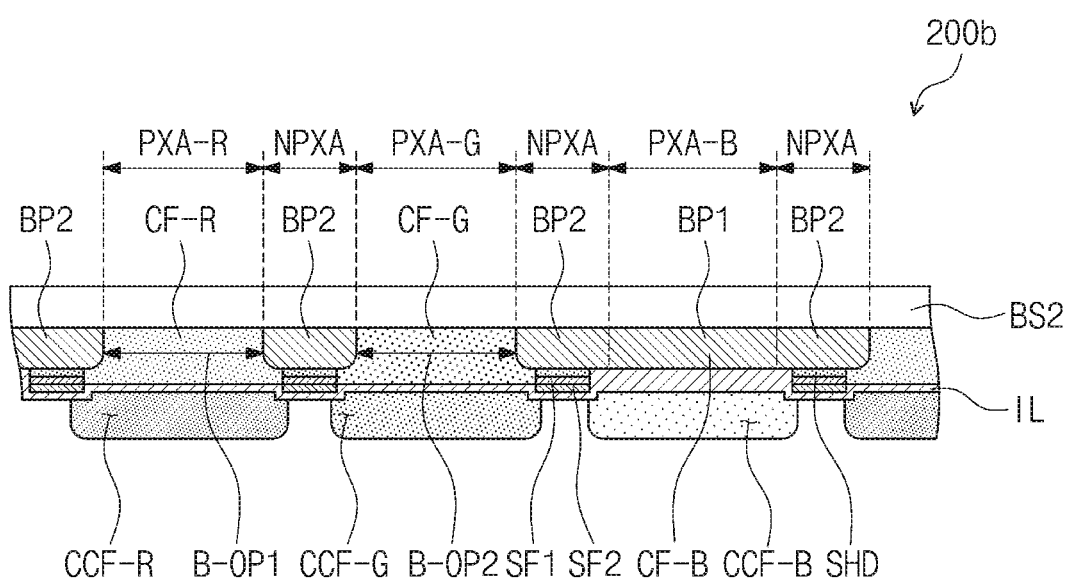
FIG. 11 is a cross-sectional view of an upper display substrate according to another embodiment of the inventive concept.

FIG. 11 is a cross-sectional view of an upper display substrate according to another embodiment of the inventive concept.

An upper display substrate 200b of FIG. 11 is substantially the same as the upper display substrate 200 of FIG. 4 except that an auxiliary color filter is added. Thus, the structure of the auxiliary color filter will be mainly described with reference to FIG. 11, and descriptions of commonly included elements and layers will be omitted for convenience of description.

Referring to FIG. 11, a first auxiliary color filter SF1 is disposed on a light blocking member SHD, and a second auxiliary color filter SF2 is disposed on the first auxiliary color filter SF1. A light blocking member BP2 is disposed on a second base substrate BS2 overlapping a light blocking area NPXA, and the light blocking member SHD is disposed on the light blocking portion BP2. The first auxiliary color filter SF1 and the second auxiliary color filter SF2 may be sequentially laminated on the light blocking member SHD. According to other embodiments, the laminated order of the first auxiliary color filter SF1 and the second auxiliary color filter SF2 may be changed.

According to an embodiment of the inventive concept, the first auxiliary color filter SF1 may have a red color that is the first color, and the second auxiliary color filter SF2 has a green color that is the second color. The first auxiliary color filter SF1 and the second auxiliary color filter SF2 may prevent the colors of the light outputted from the light control layer CCL from being mixed with each other and improve the absorption of the external light. That is, the first auxiliary color filter SF1 may absorb light of a wavelength band except for the wavelength band of the first color, and the second auxiliary color filter SF2 may absorb light of a wavelength band except for the wavelength band of the second color.

As illustrated in FIG. 11, the first to third color filters CF-R, CF-G, and CF-B do not overlap the light blocking member SHD, the first auxiliary color filter SF1, and the second auxiliary color filter SF2. That is, the first to third color filters CF-R, CF-G, and CF-B may be divided by the light blocking member SHD, the first auxiliary color filter SF1, and/or the second auxiliary color filter SF2 and may not contact each other.

Figure 12:
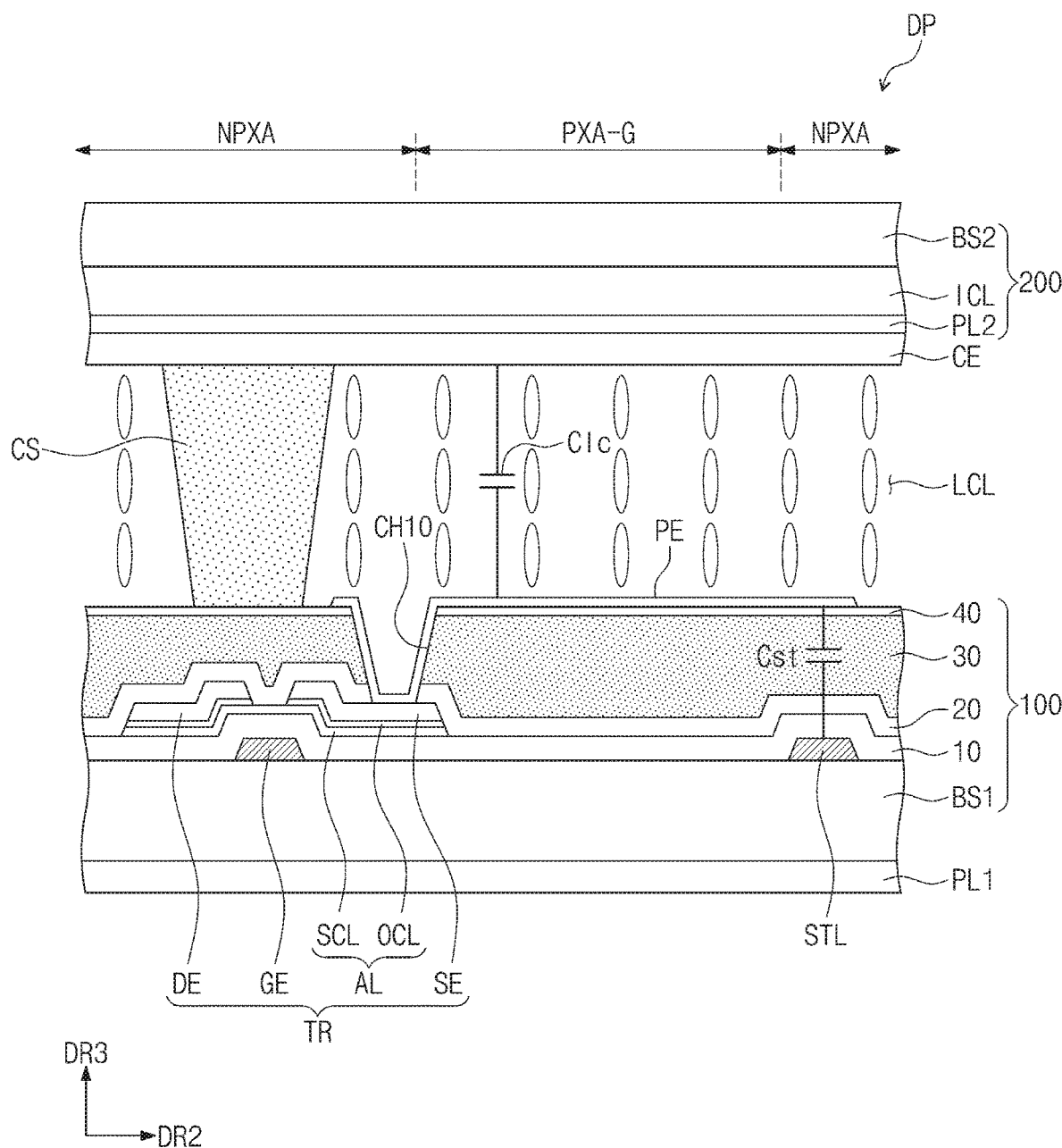
FIG. 12 is a cross-sectional view of a display panel according to an embodiment of the inventive concept.

FIG. 12 is a cross-sectional view of a display panel according to an embodiment of the inventive concept.

A pixel of a liquid crystal display panel DP of FIG. 12 may include a transistor TR, a liquid crystal capacitor Clc, and a storage capacitor Cst in an equivalent circuit.

The liquid crystal display panel DP includes a lower display substrate 100, an upper display substrate 200, and a liquid crystal layer LCL disposed between the first and second display substrates 100 and 200. A spacer CS overlapping the light blocking area NPXA may be disposed between the lower display substrate 100 and the upper display substrate 200 to maintain a gap between the first and second display substrates 100 and 200.

The liquid crystal display panel DP further includes first and second polarizer layers PL1 and PL2. The first polarizer layer PL1 may be disposed below the lower display substrate 100, and the second polarizer layer PL2 may be included in the upper display substrate 200. The second polarizer layer PL2 may include a wire grid.

The first display substrate 100 includes a first base substrate BS1. A control electrode GE and a storage line STL are disposed on a surface of the first base substrate BS1. The first base substrate BS1 may be a glass substrate or a plastic substrate. A first insulation layer 10 covering the control electrode GE and the storage line STL is disposed on the surface of the first base substrate BS1. The first insulation layer 10 may include at least one of an inorganic material and an organic material. The activation part AL overlapping the control electrode GE is disposed on the first insulation layer 10. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may include an amorphous silicon or a polysilicon. In addition, the semiconductor layer SCL may include a metal oxide semiconductor. The ohmic contact layer OCL may include a dopant doped at a density higher than that of the semiconductor layer SCL. The ohmic contact layer OCL may include two portions that are spaced apart from each other. In an embodiment of the inventive concept, the ohmic contact layer OCL may have an integrated shape.

An input electrode DE and an output electrode SE are disposed on the activation part AL. The input electrode DE and the output electrode SE are disposed to be spaced apart from each other. A second insulation layer 20 covering the activation layer AL, the input electrode DE, and the output electrode SE is disposed on the first insulation layer 10. A third insulation layer 30 is disposed on the second insulation layer 20. Each of the second insulation layer 20 and the third insulation layer 30 may include at least one of an inorganic material or an organic material. The third insulation layer 30 may be an organic layer providing a polarization surface. A fourth insulation layer 40 is disposed on the third insulation layer 30. The fourth insulation layer 40 may be an inorganic layer.

As illustrated in FIG. 12, a pixel electrode PE is disposed on the fourth insulation layer 40. The pixel electrode PE is connected to the output electrode SE through a contact hole CH10 that passes through the second insulation layer 20, the third insulation layer 30, and the fourth insulation layer 40. An alignment layer (not shown) covering the pixel electrode PE may be disposed on the fourth insulation layer 40.

The second display substrate 200 includes a second base substrate BS2. The second base substrate BS2 may be a glass substrate or a plastic substrate. An intermediate layer ICL, the second polarizer layer PL2, and a common electrode CE are disposed on a bottom surface of the second base substrate BS2. The liquid crystal layer LCL operates based on a charge or a discharge of the liquid crystal capacitor Clc. A source light from a backlight unit (not shown) may be selectively provided to the intermediate layer ICL via the first polarizer layer PL1, the liquid crystal layer LCL, and the second polarizer layer PL2.

In the present embodiment, although the intermediate layer ICL is briefly illustrated, the intermediate layer ICL may have a laminated structure. For example, the intermediate layer ICL may have a laminated structure as described with reference to FIGS. 9 and 11.

The cross-sectional view of the display panel DP illustrated in FIG. 12 is merely an example of the inventive concept of the present disclosure. Although the display panel DP in a vertical alignment (VA) mode is exemplarily described with reference to FIG. 12, a liquid crystal display panel in an in-plane switching (IPS) mode, a fringe-field switching (FFS) mode, a planar to linear switching (PLS) mode, a super vertical alignment (SVA), or a surface-stabilized vertical alignment (SS-VA) mode may be applied without deviating from the scope of the present disclosure.

According to the embodiments of the inventive concept, the light blocking member may be disposed on the light blocking portion of the third color filter having the wavelength band of the third color. Particularly, the light blocking member may include the black organic pigment. Since the light blocking member includes the black organic pigment, the reflectance of the external light that may occur at the interface between the base substrate and the light blocking member may be reduced.

As described above, the exemplary embodiments of the inventive concept of the present disclosure are disclosed with respect to the drawings and the specification. While specific terms were used, they were not intended to limit the meaning or the scope of the inventive concept, but merely used to explain the inventive concept. Accordingly, a person having ordinary skill in the art will understand from the above that various modifications and other equivalent embodiments are also possible without deviating from the scope of the present disclosure. Hence, the real protective scope of the present disclosure shall be determined by the technical scope of the accompanying claims.

What is claimed is:

1. A display panel comprising:
   a substrate;
   a plurality of pixels on the substrate;
   a plurality of color conversion layers and a plurality of color transmission layers aligned with the plurality of pixels;
   an insulating layer on the plurality of color conversion layers and the plurality of color transmission layers;
   a plurality of color filters including first color filters aligned with the plurality of color transmission layers and second color filters aligned with the plurality of color conversion layers; and
   a light blocking member having a plurality of openings aligned with the plurality of color conversion layers and the plurality of color transmission layers,
   wherein the first color filters have a plurality of openings aligned with the plurality of color conversion layers,
   wherein the light blocking member contains at least a pigment and overlaps the first color filters,
   wherein the second color filters are disposed in the plurality of openings of the first color filters and overlap a portion of the first color filters, and
   wherein the first color filters which have the plurality of openings and the second color filters which are disposed in the plurality of openings of the first color filters transmit light of different wavelengths.

2. The display panel of claim 1, wherein the first color filters transmit blue light.

3. The display panel of claim 2, wherein the light blocking member overlaps the first color filters.

4. The display panel of claim 3, wherein the pigment is a organic pigment.

5. The display panel of claim 4, wherein the light blocking member contains a black pigment.

6. The display panel of claim 5, further comprising a second substrate, wherein the second substrate directly contacts the plurality of color filters.

7. The display panel of claim 2, wherein the light blocking member is disposed on at least two auxiliary color filters that overlap the blue color filter.

8. The display panel of claim 7, further comprising a second substrate, wherein the second substrate directly contacts the plurality of color filters.

9. The display panel of claim 1, wherein the plurality of pixels emit a blue light.

10. The display panel of claim 9, wherein each of the plurality of pixels includes an organic light emitting diode (OLED).

11. The display panel of claim 10, wherein the first color filters transmit blue light.

12. The display panel of claim 11, wherein the light blocking member overlaps the first color filters.

13. The display panel of claim 12, wherein the pigment is a organic pigment.

14. The display panel of claim 13, wherein the light blocking member contains a black pigment.

15. The display panel of claim 14, further comprising a second substrate, wherein the second substrate directly contacts the plurality of color filters.

16. The display panel of claim 12, wherein the light blocking member is disposed on at least two auxiliary color filters that overlap the blue color filter.

17. The display panel of claim 13, further comprising a second substrate, wherein the second substrate directly contacts the plurality of color filters.

* * * * *